United States Patent
Ogale et al.

(10) Patent No.: US 9,594,129 B2
(45) Date of Patent: Mar. 14, 2017

(54) HIGHLY SENSITIVE MAGNETIC TUNABLE HETEROJUNCTION DEVICE FOR RESISTIVE SWITCHING

(75) Inventors: Satishchandra Balkrishna Ogale, Maharashtra (IN); Dipankar Das Sarma, Karnataka (IN); Abhimanyu Singh Rana, Maharashtra (IN); Vishal Prabhakar Thakare, Maharashtra (IN); Anil Kumar Puri, West Bengal (IN)

(73) Assignee: COUNCIL OF SCIENTIFIC & INDUSTRIAL RESEARCH, New Dehli (IN)

( * ) Notice: Subject to any disclaimer, the term of this patent is extended or adjusted under 35 U.S.C. 154(b) by 231 days.

(21) Appl. No.: 14/128,993

(22) PCT Filed: Jun. 25, 2012

(86) PCT No.: PCT/IB2012/001259
§ 371 (c)(1),
(2), (4) Date: Mar. 20, 2014

(87) PCT Pub. No.: WO2012/176064
PCT Pub. Date: Dec. 27, 2012

(65) Prior Publication Data
US 2014/0287534 A1    Sep. 25, 2014

(30) Foreign Application Priority Data
Jun. 24, 2011   (IN) .......................... 1794/DEL/2011

(51) Int. Cl.
| H01L 21/00 | (2006.01) |
| G01R 33/06 | (2006.01) |
| H01L 29/24 | (2006.01) |
| H01L 29/82 | (2006.01) |
| H01L 43/08 | (2006.01) |
| H01L 43/10 | (2006.01) |
| H01L 43/12 | (2006.01) |
| H01F 13/00 | (2006.01) |
| H01L 43/02 | (2006.01) |

(52) U.S. Cl.
CPC ............. *G01R 33/06* (2013.01); *H01F 13/00* (2013.01); *H01L 29/24* (2013.01); *H01L 29/82* (2013.01); *H01L 43/02* (2013.01); *H01L 43/08* (2013.01); *H01L 43/10* (2013.01); *H01L 43/12* (2013.01)

(58) Field of Classification Search
CPC ......... H01L 43/02; H01L 43/08; H01L 43/10; H01L 43/12; H01L 29/24; H01L 29/82
USPC ............... 438/3; 257/183; 324/252; 335/284
See application file for complete search history.

(56) References Cited

U.S. PATENT DOCUMENTS

2006/0183249 A1*   8/2006   Yao ..................... C23C 18/1216
                                                                438/3

OTHER PUBLICATIONS

Nelson-Cheeseman, B. B. et al. (2010). Room temperature magnetic barrier layers in magnetic tunnel junctions. *The American Physical Society, Physical Review B*, 81, 214421-1-214421-7.
Fritsch, D. and Ederer, C. (2011). Strain effects in spinel ferrite thin films from first principles calculations. *Journal of Physics: Conference Series*, 292(1), 012014 1-5.
Tsuchiya, T. et al. (2009). Influence of the laser wavelength on the epitaxial growth and electrical properties of $La_{0.8}Sr_{0.2}MnO_3$ films grown by excimer laser-assisted MOD. *Applied Surface Science*, 255(24), 9804-9807.
Tsuchiya, T. et al. (2009). Epitaxial growth of LSMO film prepared by excimer laser-assisted metal organic deposition (ELAMOD). *Key Engineering Materials*, 388, 133-136.
International Search Report, mailed Oct. 11, 2012 in connection with PCT International Application No. PCT/IB2012/001259, filed Jun. 25, 2012.
Written Opinion of the International Searching Authority, mailed Oct. 11, 2012 in connection with PCT International Application No. PCT/IB2012/001259, filed Jun. 25, 2012.
Notification Concerning Transmittal of International Preliminary Report on Patentability (Chapter I of the Patent Cooperation Treaty), including an International Preliminary Report on Patentability and Written Opinion of the International Searching Authority, mailed Jan. 9, 2014 by the International Bureau of WIPO in connection with PCT International Application No. PCT/IB2012/001259, filed Jun. 25, 2012.

* cited by examiner

*Primary Examiner* — Victor A Mandala
*Assistant Examiner* — Colleen E Snow
(74) *Attorney, Agent, or Firm* — John P. White; Cooper & Dunham LLP

(57) ABSTRACT

The present invention discloses highly sensitive magnetic heterojunction device consisting of a composite comprising ferromagnetic ($La_{0.66}Sr_{0.34}MnO_3$) LSMO layer with ultra-thin ferrimagnetic $CoFe_2O_4$ (CFO) layer capable of giant resistive switching (RS) which can be tuned at micro tesla magnetic field at room temperature.

9 Claims, 7 Drawing Sheets

HIGHLY SENSITIVE MAGNETIC TUNABLE HETEROJUNCTION DEVICE FOR RESISTIVE SWITCHING

The following specification particularly describes the invention and the manner in which it is to be performed:

CROSS-REFERENCE TO RELATED APPLICATIONS

This application is a §371 national stage of PCT International Application No. PCT/IB2012/001259, filed Jun. 25, 2012, claiming priority of Indian Patent Application No. 1794/DEL/2011, filed Jun. 24, 2011, the content of each of which is hereby incorporated by reference in its entirety.

FIELD OF THE INVENTION

The invention relates to highly sensitive magnetic heterojunction device of ultrathin $CoFe_2O_4$ (CFO) on $La_{0.66}Sr_{0.34}MnO_3$ (LSMO) capable of resistive switching (RS) which is tunable at micro tesla magnetic field.

BACKGROUND AND PRIOR ART OF THE INVENTION

Metal oxides, particularly mixed-valent manganites are at the focus of scientific attention in recent times in view of their peculiar properties emanating from a competition between different attendant energies (charge, spin, orbital and lattice).

The high carrier densities in such functional oxide systems are considered a big plus in their potential for future electronics at the nanoscale where silicon based systems face carrier statistics problems. Therefore extensive research work is being done on exploring the properties of heterostructures and multi-layers involving these and other lattice-matched oxide systems seeking novel phenomena. Recently, some unique, unusual and novel physical properties have been reported in the domains of transport and magnetism in such oxide based interface systems. Uni polar and bipolar switching has been observed in different film and interface systems, and mechanisms based on filamentary path formation or field induced interface barrier modification have been proposed.

Resistive switching (RS) is an especially interesting phenomenon that has attracted recent attention in view of its potential for alternative high density non-volatile memory application. Unipolar and bipolar switching has been observed in different film and interface systems, and mechanisms based on filamentary path formation or field induced interface barrier modification have been proposed [J. Maier, Nature Mater. 4, 805 (2005); R Waser, R Dittmann, G Staikov, and K Szot, Adv. Mater. 21, 2632 (2009)]. In manganites, resistive switching (RS) was first reported in $Pr_xCa_{1-x}MnO_3$ (PCMO, a charge ordered (CO) insulator) in the hole doping regime (x=0.1-1.0) having lowest bandwidth amongst the manganite family. The melting of the CO state with concurrent appearance of ferromagnetic nuclei under external perturbations (electric/magnetic fields, current, temperature etc) led to a large resistance reduction. Subsequent studies have brought out the significance of interfacial effects in RS in manganites and various related models have also been proposed.

There is one previous report by Das et al [S. Das, S. Majumdar, S. Giri, J. Phys. Chem. C 114, 6671 (2010)] on low field magnetic tuning of RS in very thick (83 nm) sol-gel deposited NiO films but only at low temperature.

An article titled "Room Temperature Magnetic Barrier Layers in Magnetic Tunnel Junctions" by B. B. Nelson-Cheeseman, F. J. Wong et. al in APS Journals, Phys. Rev. B Volume 81, Issue 21 relates to the spin transport and interfacial magnetism of magnetic tunnel junctions with highly spin polarized LSMO and $Fe_3O_4$ electrodes and a ferrimagnetic $NiFe_2O_4$ (NFO) barrier layer. The spin dependent transport is explained in terms of magnon-assisted spin dependent tunneling where the magnons are excited in the barrier layer itself. Tri layers of LSMO (25 nm)/NFO (3 nm)/$Fe_3O_4$ (25 nm) were grown by pulsed laser deposition on (110)-oriented $SrTiO_3$ (STO) substrates. Magnetization is induced at +/−1.5 Tesla and the magnetic field applied is in the range of −2000 to +2000 Oe.

Article titled "Current switching of resistive states in magnetic resistive manganites" by A. Asamitsu discloses crystals of $Pr_{1-x}Ca_xMnO_3$ (x=0.3) which were melt-grown by a floating-zone method. The crystals showed the switching phenomenon in a much higher magnetic field of approx. 4 tesla.

Though, resistive switching is demonstrated in other metal oxides systems and their interfaces and shown to be tuned under magnetic fields, however the "magnetic" aspect of magnetic oxides has not been emphasized especially in terms of low field tenability.

OBJECTIVE OF THE INVENTION

Main objective of the present invention is to provide a highly sensitive magnetic heterojunction device of ultra thin $CoFe_2O_4$ (CFO) on $La_{0.66}Sr_{0.34}MnO_3$ (LSMO) capable of resistive switching (RS) which is tunable at micro tesla magnetic field.

Another objective of the present invention is to provide a magnetic heterojunction device to tune the resistive switching at very low magnetic field with high sensitivity.

SUMMARY OF THE INVENTION

Accordingly, present invention provides a highly sensitive magnetic heterojunction device comprising substrate of single crystal (001) $LaAlO_3$ (LAO), ferromagnetic $La_{0.66}Sr_{0.34}$ $MnO_3$ layer (LSMO) and ferrimagnetic $CoFe_2O_4$ (CFO) layer.

In an embodiment of the present invention, said device is capable of giant resistive switching (RS) at the interfaces of LSMO and CFO at 2 to 100 mT magnetic field at temperature in the range of 25 to 30° C. for alternative high density non-volatile memory application.

In another embodiment of the present invention, the thickness of the substrate is 450 to 550 μm.

Yet another embodiment of the present invention, the thickness of the LSMO layer is in the range of 100 to 130 nm.

Yet another embodiment of the present invention, the thickness of the CFO is in the range of 2 to 6 nm.

Yet another embodiment of the present invention, device exhibits resistive switching voltage in the range of 0.7 to 2V for 2 to 6 nm CFO in the presence of 72 mT magnetic field at temperature in the range of 25 to 30° C.

Yet another embodiment of the present invention, the device is magneto restrictive and senses magnetic field.

Yet another embodiment of the present invention, the process for the preparation of heterojunction device comprising the steps of:

a. depositing 100 to 130 nm ($La_{0.66}Sr_{0.34}MnO_3$) LSMO film on 450 to 550 μm single crystal (001) $LaAlO_3$ (LAO) substrate by Pulse layer deposition (PLD) at 700° C. in 100 mTorr oxygen pressure;
b. masking part of the film as obtained in step (a) followed by growing of 15 to 25 nm LSMO onto the masked surface by PLD at 700° C. in 100 mTorr oxygen pressure to form a thin film; and
c. depositing 2 to 6 μm film of CFO on to the LSMO film as obtained in step (b) by PLD at 700° C. in 100 mTorr oxygen pressure followed by cooling till temperature in the range of 25 to 30° C. at oxygen pressure of 400 torr;

Yet another embodiment of the present invention, a method of detecting a magnetic field using CFO/LSMO comprises;
a. providing Highly sensitive magnetic heterojunction device;
b. exposing the device to a magnetic field so as to detect the magnetic field.

Yet another embodiment of the present invention, a method of inducing a magnetic field using CFO/LSMO comprises;
a. providing Highly sensitive magnetic heterojunction device;
b. Exposing the device at an electrical current to induce a magnetic field.

DETAILED DESCRIPTION OF INVENTION

Figure 1:
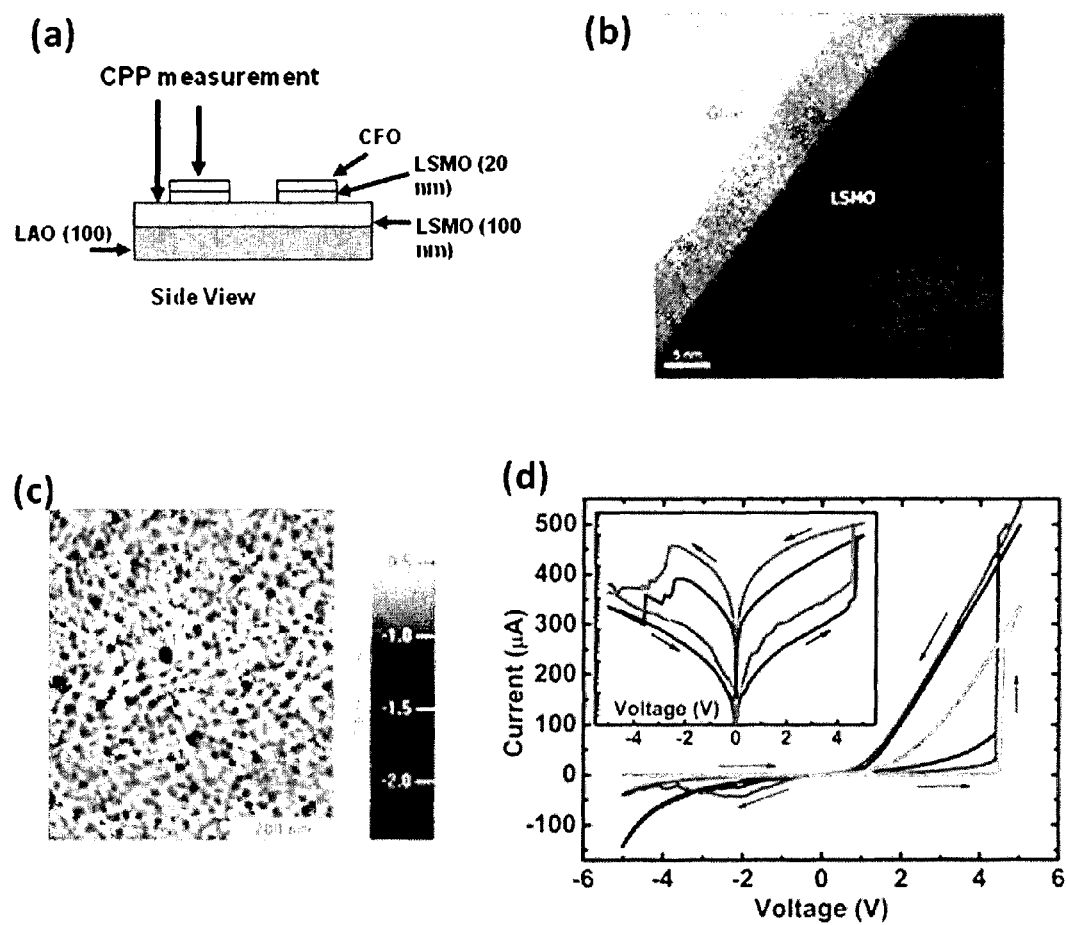
FIG. 1a represents the ultrathin heterojunction device comprised of a single crystal (001) $LaAlO_3$ (LAO) substrate (500 μm), a $La_{0.66}Sr_{0.34}MnO_3$ (LSMO) film (100 nm), and freshly grown heterostructure of LSMO (20 nm, as bottom layer) and $CoFe_2O_4$ (CFO) of different thickness (2 nm, 4 nm, 6 nm, as top layers). The arrows in CPP measurement indicate where the voltage probes were put so as to perform current-voltage measurements.
FIG. 1b represents Cross sectional Transmission electron microscopy (TEM) image of 4 nm CFO/LSMO interface.
FIG. 1c represents conducting AFM (Atomic Force Microscopy) image of 4 nm CFO/LSMO interface.
FIG. 1d represents typical I-V curves noted in the absence of magnetic field across LSMO-CFO interface in current perpendicular to plane (CPP) mode for different CFO thicknesses (Black for 2 nm, Red for 4 nm, and Green for 6 nm), Inset shows RS (Resistive switching) curves for two different device areas, namely 2 mm×3 mm and 500 μm×500 μm.

The invention relates to highly sensitive magnetic heterojunction device consisting of ultrathin ferrimagnetic $CoFe_2O_4$ (CFO) and ferromagnetic $La_{0.66}Sr_{0.34}MnO_3$ (LSMO) capable of giant resistive switching (RS) which is tunable at micro tesla magnetic field (at much lower field) at room temperature.

In an aspect, there is provided a novel heterojunction device of ultrathin $CoFe_2O_4$ (CFO) on $La_{0.66}Sr_{0.34}MnO_3$ (LSMO) which are grown by pulsed laser deposition (PLD) and examined for the current-voltage (I-V) characteristics in the current perpendicular to plane (CPP) geometry. These measurements on such an in situ grown interface reveal rectifying nature with a giant resistive switching. The switching voltage is magnetically tunable at much lower fields with high sensitivity. The device exhibit rectifying characteristics in CPP and the threshold voltage for resistive switching as well as the conductance at switching show systematic and synergistic variation with magnetic field.

The term 'magnetic tunable Resistive switching' described herein the specification refers and means to the physical phenomena where a dielectric suddenly changes its (two terminal) resistance switching under the action of applied voltage and this voltage essential to switch the device changes in the presence of magnetic field. The change of resistance is non-volatile and reversible.

The term 'heterojunction' or 'interface system' refers and means to the interface that occurs between CFO and LMSO layers or regions.

The term 'Switching voltage' refers to the maximum signal voltage across switch module necessary to switch its resistance state.

CFO is a ferrimagnetic insulator which is known for its very high magnetostriction coefficient [R. Bozorth, E. Tilden & A. Williams, *Phys. Rev.* 99, 1788 (1955).] ($\lambda \sim 800 \times 10^{-6}$) and a very efficient spin filtering effect [A. Ramos, M.-J. Guittet, J.-B. Moussyet, R. Mattana, C. Deranlot, F. Petroff, C. Gatel, *Appl. Phys. Lett.* 91, 122107 (2007)] at room temperature.

$La_{1-x}Sr_xMnO_3$ (x=0.34, as determined by Rutherford Backscattering) is a ferromagnetic conductor at room temperature due to large bandwidth and nearly linear $Mn^{3+}$—O—$Mn^{4+}$ bond. Small changes in the Mn—O—Mn bond properties at an interface can however change the transport and magnetic properties significantly. [A. Rana, Kashinath Bogle, Onkar Game, Shankar Patil, Nagarajan Valanoor, Satishchandra Ogale, *Appl. Phys. Lett.* 96, 263108 (2010);

A. Urushibara, Y. Moritomo, T. Arima, A. Asamitsu, G. Kido, Y. Tokura, *Phys. Rev. B* 51, 14103 (1995).]

The heterojunction device of the instant invention comprising of ultra-thin $CoFe_2O_4/La_{0.66}Sr_{0.34}MnO_3$ displays an interface system for resistive switching (RS) and shows a very sharp (bipolar) transition at room temperature (27° C.) that can be gated with high sensitivity by low magnetic fields. The said device is thus senses magnetic fields. The interfaces of $La_{0.66}Sr_{0.34}MnO_3$ (LSMO) and ultrathin $CoFe_2O_4$ (CFO) show very unique and interesting magneto-electronic coupling in the resistive switching phenomenon with remarkably high magnetic field sensitivity at micro Tesla level in the range of 2-100 mT at room temperature (27° C.).

The device consists of magentorestrictive film $CoFe_2O_4$ (CFO) layer grown on LSMO (120 nm) layer with a thickness in the range of 2-6 nm.

The observed change in resistive switching voltage in the presence of magnetic field is ~2 V at 72 mT at the interface of LSMO/CFO (2 nm CFO case) at room temperature (27° C.) in the heterojunction device of the instant invention.

The heterojunction device composite consisting of two materials is grown by Pulse layer deposition (PLD) technique, which is known for deposition layer by atomic layer, using KrF excimer (laser, $\lambda=248$ nm, 20 ns pulse). The laser ablation was carried out at energy density of 2 $J/cm^2$ and a repetition rate of 10 Hz. The upper layer is CFO (which acts as ferrimagnetic insulator) and the bottom layer is $La_{1-x}Sr_xMnO_3$ (x=0.34) which is a ferromagnetic conductor at room temperature due to broader bandwidth and nearly linear $Mn^{3+}$—O—$Mn^{4+}$ bond.

The process for the preparation of heterojunction device of ultrathin $CoFe_2O_4/La_{0.66}Sr_{0.34}MnO_3$ comprises;
1. Depositing $(La_{0.66}Sr_{0.34}MnO_3)$ LSMO film [Abhimanyu Rana, Kashinath Bogle, Onkar Game, Shankar Patil, Nagarajan Valanoor, and Satishchandra Ogale, *Appl. Phys. Lett.* 96, 263108 (2010)] on a single crystal (001) $LaAlO_3$ (LAO) substrate by PLD (Pulsed laser deposition) at 700° C. in 100 mTorr oxygen pressure;
2. Masking part of the film of step (1) followed by growing of LSMO onto the masked surface by PLD at 700° C. in 100 mTorr oxygen pressure to form a thin film;
3. Depositing a thin film (2 to 6 nm) of CFO on to the LSMO film of step (2) by PLD at 700° C. in 100 mTorr oxygen pressure and cooling at oxygen pressure of 400 torr.

According to the process described above, a 100 nm uniform LSMO film is deposited on a single crystal (001) $LaAlO_3$ (LAO) substrate by PLD at 700° C. in 100 mTorr oxygen pressure. Subsequently, a mask is put on part of the 100 nm film surface, and a 20 nm LSMO film is grown through the mask (to create a fresh LSMO surface) by PLD technique at same temperature and oxygen pressure. This is immediately followed by deposition of a few nm thick (2 to 6 nm) CFO film by PLD at 700° C. in 100 mTorr oxygen pressure, cooled at oxygen pressure of 400 torr to obtain the desired ultra-thin heterojunction device. The ultrathin heterojunction device is shown in FIG. 1 (*a*). The ultra-thin heterojunction is characterized by TEM as described in [FIG. 1 (*b*)], Atomic force microscopy (AFM) in FIG. 1 (*c*). The Transmission electron Microscopy (TEM) cross section image [FIG. 1 (*b*)] of CFO/LSMO heterostructure shows parallel lattice planes, thickness uniformity and high degree of surface smoothness Atomic force microscopy (AFM) topographic image [Root mean square (RMS) roughness of ~0.4 nm] and concurrently acquired conducting-AFM (CAFM) image at negative sample bias of −3.5 V is described in [FIG. 1 (*c*)]. The spatial distribution of current, measured by CAFM in CPP configuration, is observed to be uniform throughout the interface with a nanoscale modulation of current near grain boundaries.

The present invention further relates to a method of detecting a magnetic field using CFO/LSMO comprises;
1. Providing the ultra-thin heterojunction device comprising of CEO and LSMO which is capable of resistive switching and resistive switching is magnetically tunable;
2. Exposing the device to a magnetic field while the current-voltage measurement will be performed simultaneously. As the magnetic field is changed; the resistive switching voltage will also change which is nothing but a measure of applied external magnetic field.
3. Current—voltage measurements will be performed in a current perpendicular to plane (CPP) geometry as shown in FIG. 1 (*a*).

The rectifying characteristics in CPP across LSMO-CFO interface for different CFO thicknesses (2 nm, 4 nm, 6 nm) and the threshold voltage for different CFO thicknesses in absence of magnetic field are described below:

FIG. 1 (*d*), shows typical I-V curves obtained for different CFO thickness values. A large RS is seen towards positive polarity (LSMO+ve terminal) at a threshold voltage ~4.45 V (±0.05) for all the CFO thicknesses (2 nm, 4 nm and 6 nm). A reverse transition occurs from LRS to HRS in the negative bias cycle, though it is not as sharp as the positive cycle. Independence of RS switching voltage on CFO layer thickness implies that it is a purely interfacial phenomenon. The inset to FIG. 1(*d*) shows RS curves for two different device areas, namely 2 mm×3 mm and 500 μm×500 μm. It is clearly observed that the resistance values for the HRS & LRS increase with decreasing lateral area which is completely consistent with the interfacial type resistive switching.

The current perpendicular to plane (CPP) transport is studied across these interfaces in which the voltage is varied in a sweeping cycle (−5 V→0V→5V→0V→−5 V) with a sweep rate of 1.0 V/s and a step of 0.05 V and the current is recorded. Surprisingly, a giant resistive switching is observed invariably across all of these interfaces. (In the CPP transport the top contact for the I-V measurements is Indium).

FIG. 2*a* shows typical I-V curves noted across an interface for CFO thicknesses of 2 nm. It shows a systematic reduction of Resistive switching voltage with increasing magnetic field.

The diode-like rectifying characteristics observed above for the present interfacial type is commonly seen in p-n junction interfaces of doped manganites. The higher current values in LRS state can be attributed to the transport of current through CFO grain boundaries as evident from CAFM image discussed above. The mechanism for such rectification is attributed to the formation of Schottky barrier which is seen at the metal-manganite interfaces, particularly in the case of the $Pr_{0.7}Ca_{0.3}MnO_3$ (PCMO)[A. Sawa, T. Fujii, M. Kawasaki, and Y. Tokura, *Appl. Phys. Lett.* 85, 4073 (2004); A. Sawa, T. Fujii, M. Kawasaki, Y. Tokura, *Appl. Phys. Lett.* 88, 232112 (2006)] which showed rectifying character only after depositing a few unit cells of insulating $Sm_{0.3}Ca_{0.3}MnO_3$ (SCMO) on LSMO. Therefore, it can be concluded that the insulating nature of CFO layer and its band alignment play an important role in the surface electronic barrier modification that can lead to Schottky type rectification.

Figure 2:
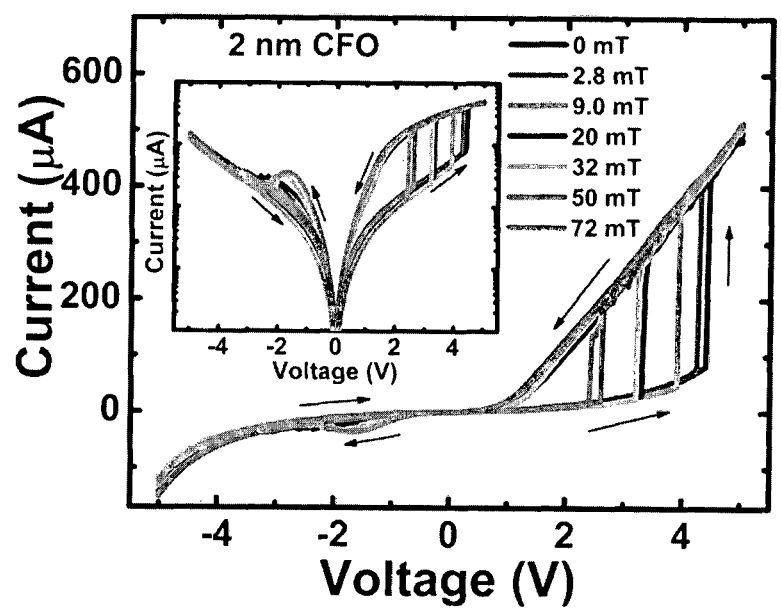
FIG. 2a represents I-V characteristics of the samples of CFO thicknesses (2 nm) under finely tuned magnetic field, showing a systematic variation of threshold voltage with magnetic field. Insets: I-V curves at log scale.
FIG. 2b represents I-V characteristics of the samples of CFO thicknesses (4 nm) under finely tuned magnetic field, showing a systematic variation of threshold voltage with magnetic field. Insets: I-V curves at log scale.
FIG. 2c represents I-V characteristics of the samples of CFO thickness (6 nm) under finely tuned magnetic field, showing a systematic variation of threshold switching voltage (switching voltage) with magnetic field. Insets: I-V curves at log scale.
Figure 2:
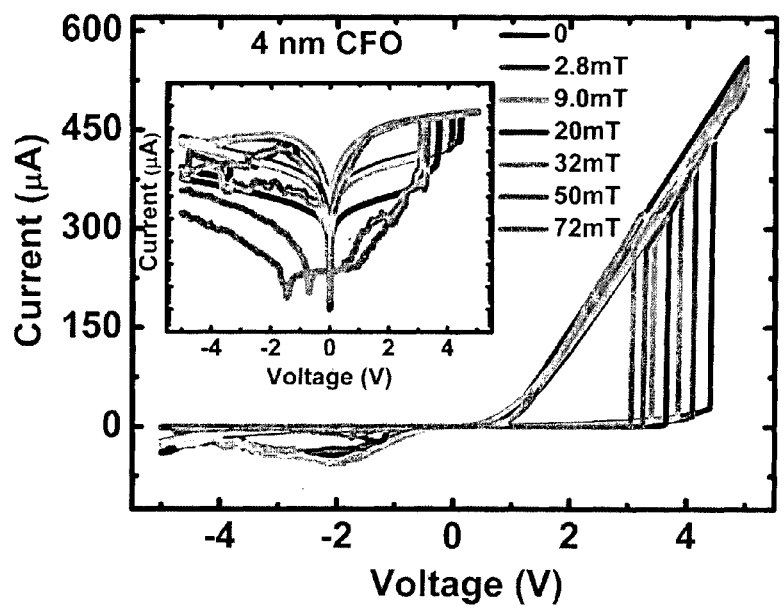
Figure 2:
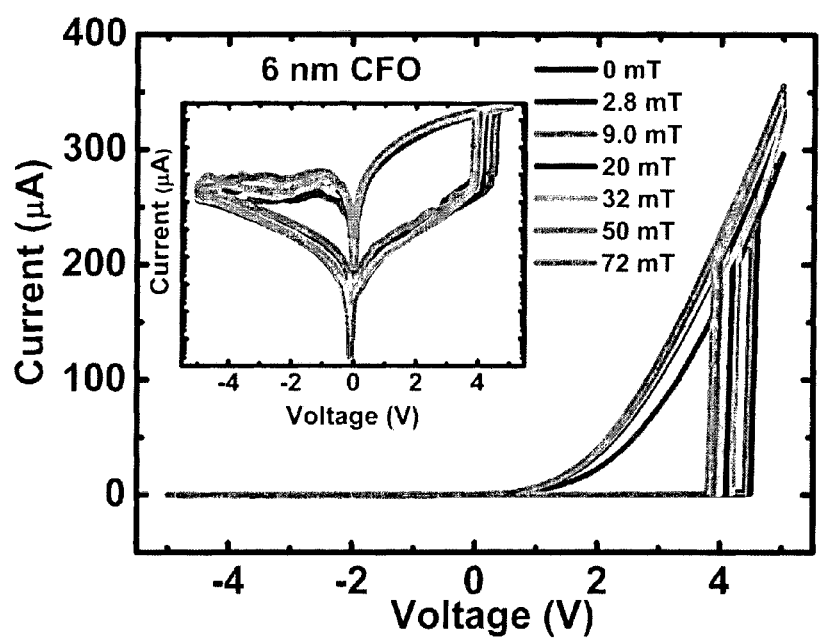
Figure 3:
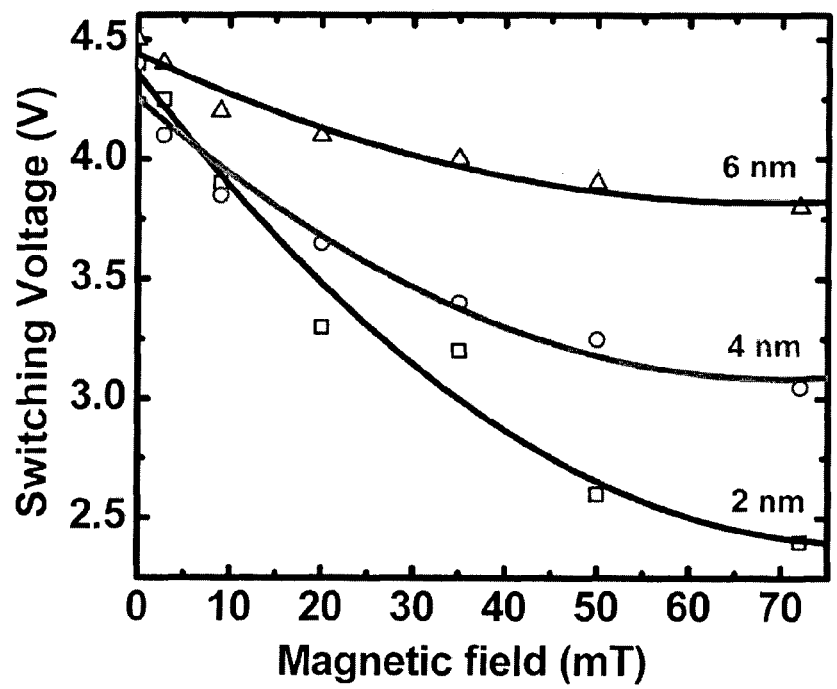
FIG. 3a represents the systematic variation of threshold switching voltage ($V_{th}$) with magnetic field for different CFO thicknesses.
FIG. 3b represents effect of magnetic field direction on resistive switching.
Figure 3:
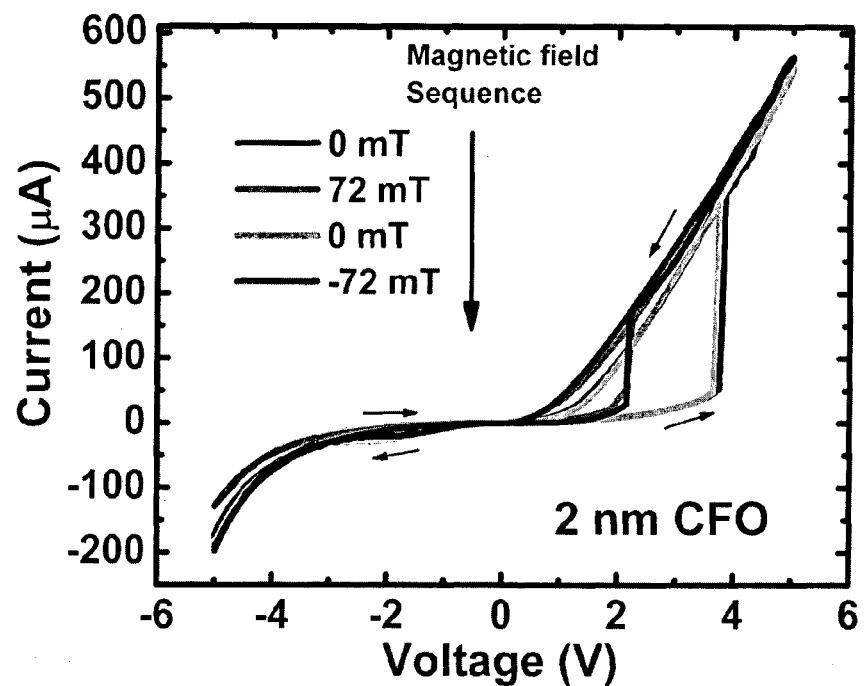

In another embodiment, the high sensitive magnetic tunable resistive switching of the novel ultra-thin heterostructure across magnetic ($La_{0.66}Sr_{0.34}MnO_3$) LSMO and $CoFe_2O_4$ (CFO) hetero-junction is described herein below:

FIG. 2 (b), (c) show the resistive switching curve for 4 nm and 6 nm CFO thicknesses as a function of magnetic field applied up to 72 mT in steps The switching voltage is seen to be reduced substantially with increasing magnetic field used for all the cases of CFO thicknesses at fairly low fields without losing the sharpness of the transition. Most remarkably the switching voltage shift depends rather strongly on the CFO thickness in the presence of magnetic field Further, FIG. 3 (a), shows the variation of resistive switching voltage ($V_{th}$) as a function of applied magnetic field. It is also observed that the effect of magnetic field variation reduces with increasing CFO thickness which indicates a strong and interesting coupling between the magnetic field and the phenomena governing the switching electric field value. The observed shift in resistive switching voltage at 72 mT is ~2 V, ~1.4 V, and ~0.7V for 2 nm, 4 nm and 6 nm CFO cases respectively. The reversal of magnetic field direction does not seem to be affecting the trend of RS voltage shift [FIG. 3(b)].

Figure 4:
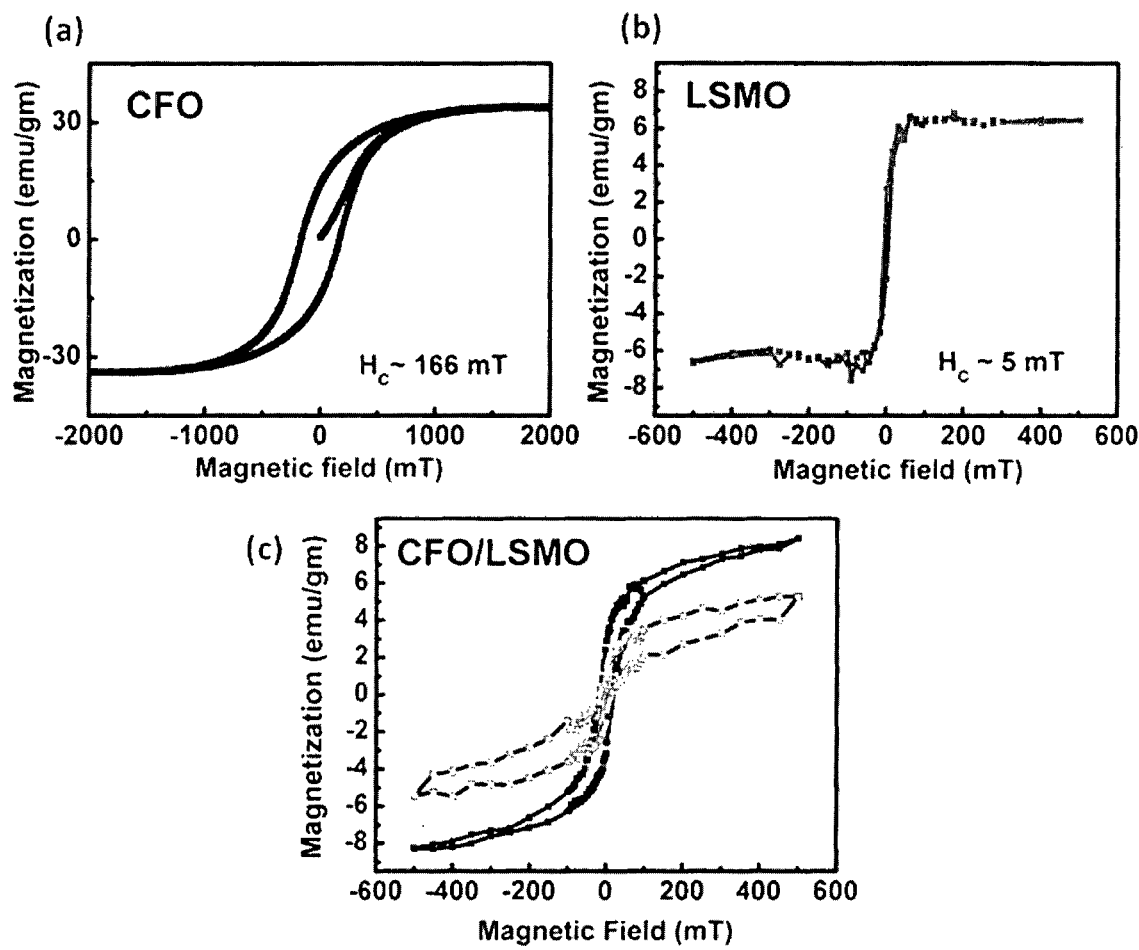
FIG. 4a represents the magnetization curve of bare CFO thin film (100 nm).
FIG. 4b represents the magnetization curves of bare LSMO thin film (120 nm)
FIG. 4c represents the magnetization curves of LSMO-CFO junction for 2 nm (Black curve) and 6 nm (Blue curve) thickness of CFO.

Clearly the mechanism in the present invention, which involves a large bandwidth manganite interfaced with high-resistivity CFO, is very different as discussed later. It is also useful to state that magnetization measurements FIG. 4 (a)-(c), revealed anti-ferromagnetic coupling between LSMO and CFO. The RS phenomenon was also studied by changing reverse bias voltage ($V_{rb}$) from 0 V, −1V, −2V to −7V before the positive sweep [FIG. 5 (a)]. It was observed that the threshold voltage ($V_{th}$) required to switch the device from High resistance state (HRS) to Low resistance state (LRS) increases with increasing negative bias. This observation implies that the entity governing the RS is influenced not just by the polarity of applied electric field but also by its strength. This suggests the role of oxygen vacancies in the modification of Schottky barrier leading to RS and also rules out possible role of Joule heating effect because in that case the reduction of $V_{rb}$ would have made the device to switch at higher $V_{th}$. [H. Peng, G. P. Li, J. Y. Ye, Z. P. Wei, Z. Zhang, D. D. Wang, G. Z. Xing and T. Wu, Appl. Phys. Lett. 96, 192113 (2010), S. X. Wu, L. M. Xu, X. J. Xing, S. M. Chen, Y. B. Yuan, Y. J. Liu, Y. P. Yu, X. Y. Li, and S. W. Lia, Appl. Phys. Lett. 93, 043502 (2008)]

Figure 5:
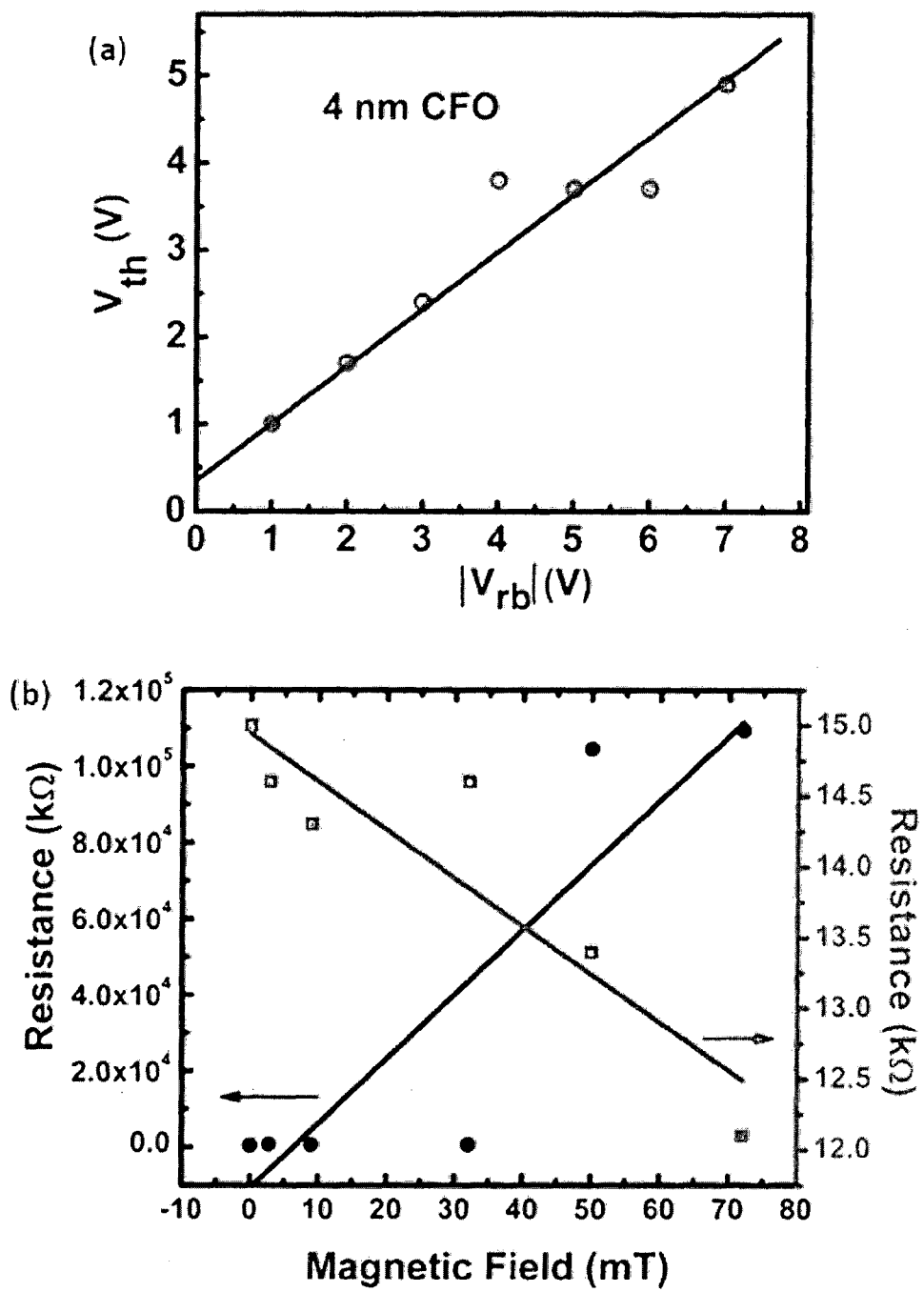
FIG. 5a represents threshold switching voltage ($V_{th}$) as a function of reverse bias voltage $|V_{rb}|$ for 4 nm CFO.
FIG. 5b represents resistance plotted as a function of magnetic field in High resistance state (HRS) (Black solid circle) and low resistance state (LRS) (Red square).

Another related important observation is the increase of device resistance in HRS with increasing magnetic field [FIG. 5 (b)]. Positive Magneto-resistance (MR) has been previously reported for LSMO in contact with Nb-doped SrTiO3 (Nb-STO) where the electronic interactions at the interface of the junction are suggested to be responsible. [K. Jin, Hui-bin Lu, Qing-li Zhou, Kun Zhao, Bo-lin Cheng, Zheng-hao Chen, Yue-liang Zhou, and Guo-Zhen Yang, Phys. Rev. B, 71, 184428 (2005)]. On the other hand in LRS the resistance is seen to decrease with increasing magnetic field (negative MR), a behavior of the bulk LSMO. This observation implies that in HRS the interface defines and controls the transport, while in LRS the bulk of LSMO controls the transport.

Figure 6:
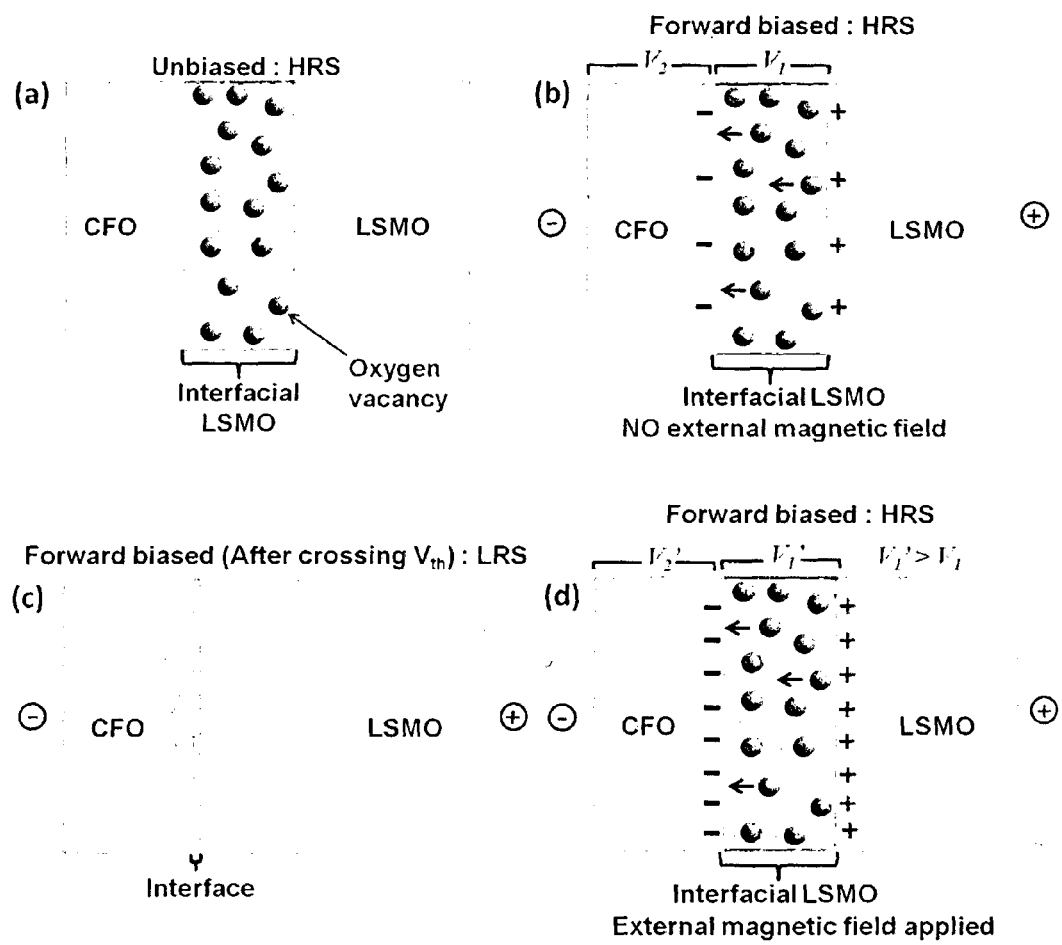
FIG. 6 represents schematic showing (a) unbiased interfacial barrier formed at LSMO/CFO interface as a result of oxygen vacancies in HRS, (b) under forward bias before switching in the absence of external magnetic field (c) under forward bias after switching (crossing) from HRS to LRS, (d) under forward bias HRS in the presence of external magnetic field.

The possible explanation for the above observation is that in the LSMO/CFO device, bulk LSMO away from interface is metallic at room temperature while the interfacial LSMO and the CFO layer are expected to contribute significantly to the device resistance. As suggested by the weak CFO thickness dependence of the switching voltage, the LSMO layer near the interface dominates the resistance in the HRS [FIG. 6 (a)]. Under forward bias the voltage is primarily shared by the CFO and the interfacial LSMO layer. As external voltage increases, voltage drop across the interfacial LSMO layer increases reaching a threshold value which pushes the positively charged oxygen vacancies into the CFO layer [FIG. 6 (b)]. Exclusion of oxygen vacancies from the interfacial LSMO increases its metallicity, thereby quenching the insulating interfacial barrier leading to switching from the HRS to the LRS [FIG. 6 (c)]. Similarly, when device is reverse biased the oxygen vacancies revert back into the interfacial LSMO layer, eventually making it insulating, and switching the device back again from the LRS to HRS.

If V is the external applied voltage at which the device switches from HRS to LRS in the absence of magnetic field, the voltage drops across the interfacial LSMO and CFO is $V_1$ and $V_2$, respectively, in proportion to their resistance values, such that $V=V_1+V_2$. Thus $V_1$ is the actual voltage essential to push oxygen vacancies into CFO and switch the device from HRS to LRS. Remembering that the HRS resistance of the interfacial LSMO layer is increased by the magnetic field (positive MR) the relative voltage drop across it must increase [FIG. 6 (d)]. Since the minimum essential voltage for switching of the LSMO interfacial layer is fixed, the device will now switch from HRS to LRS at lesser applied voltage in the presence of magnetic field, as observed here. The key element in this argument is the possible origin of the positive MR of the interfacial LSMO layer which forms a junction with the lower resistivity metallic LSMO. A clue in this respect can be obtained from the work of Jin et al. [K. Jin, Hui-bin Lu, Qing-li Zhou, Kun Zhao, Bo-lin Cheng, Zheng-hao Chen, Yue-liang Zhou, and Guo-Zhen Yang, Phys. Rev. B 71, 184428 (2005)] on the Nb:STO/LSMO interface wherein the authors discuss how the relative spin polarization of the electrons around the Fermi level in each region of the junction determines how its MR is affected. In the LSMO system the $t_{2g}$ spin up band is full and $e_g$ spin up band is partially filled. The $t_{2g}$ spin down band is higher in energy and hence unfilled. Now in the Schottky junction formation process electrons spill over in to the interfacial LSMO and initially fill the partially filled $e_g$ band followed by partial filling of $t_{2g}$ spin down band leading to band bending until the Fermi levels match. In the CPP transport process it is the spin scattering of spin up electrons by the $t_{2g}$ spin down electrons in this region that can lead to positive MR.

The observed phenomenon of resistive switching ultimately leads to switching current that may be utilized to fabricate electromagnets at micro and nano scale. This can also be used for various applications like nanofabricating ferromagnetic domains with STM-tip in antiferromagnetic films, which can also be used for Radio-frequency identification (RFID) [A. Asamitsu, Y. Tomioka, H. Kuwahara, and Y. Tokura, Nature 388, 50-52 (1997)].

The present invention provides a giant resistive switching at room temperature in CFO/LSMO heterostructures (grown by pulsed laser deposition, PLD) which is magnetically tunable with high sensitivity at fairly low magnetic fields. Remarkably, the switching does not show significant CFO thickness dependence in the absence of magnetic field, but a strong CFO thickness dependence under applied magnetic field. The devices exhibit rectifying characteristics in CPP geometry and the threshold voltage for resistive switching as well as the conductance at switching show systematic and synergistic variation with magnetic field.

EXAMPLES

Following examples are given by way of illustration and therefore should not be construed to limit the scope of the invention.

Example 1

Preparation of the Heterojunction Device of Ultra-Thin $CoFe_2O_4La_{0.66}Sr_{0.34}MnO_3$ A 100 nm uniform LSMO film is deposited on a single crystal (001) $LaAlO_3$ (LAO) substrate (substrate thickness is 500 µm) from 99.9% purity LSMO target by PLD at 700° C. in 100 mTorr oxygen pressure. Subsequently, a mask is put on part of the 100 nm film surface, and a 20 nm LSMO film is grown through the mask (to create a fresh LSMO surface) by PLD technique at same temperature and oxygen pressure. This is immediately followed by deposition of a 2 to 6 nm CFO film from 99.9% pure CFO target by PLD at 700° C. in 100 mTorr oxygen pressure to obtain the desired ultra-thin heterojunction device. The films were cooled up to room temperature at oxygen pressure of 400 torr.

Example 2

Magnetization Studies

Magnetization studies were performed by a superconducting quantum interference device—Vibrating sample magnetometer (SQUID-VSM), an accepted well known technique for determination of magnetic properties of a material.

ADVANTAGES OF THE INVENTION

1. Magnetic switching disclosed herein finds application in memory devices, sensing magnetic fields.
2. It can be used for induction of magnetic field at micro or nano level.
3. The heterojunction is a simple device that elicits this effect of tuning of resistive switching with magnetic field.

We claim:

1. A highly sensitive magnetic heterojunction device comprising:
    substrate of single crystal (001) $LaAlO_3$ (LAO);
    a first ferromagnetic $La_{0.66}Sr_{0.34}MnO_3$ (LSMO) layer;
    a second ferromagnetic LSMO layer grown on the first LSMO layer through a mask disposed between the first and second LSMO layer in about 100 mTorr oxygen pressure, to form a thin film and a pure LSMO surface; and
    ferrimagnetic $CoFe_2O_4$ (CFO) layer disposed on the first LSMO layer, the CFO layer having been deposited on the first LSMO layer in about 100 mTorr oxygen pressure, to obtain thickness uniformity and surface smoothness in the CFO layer and to cause giant resistive switching (RS) to be performed at an interface between the LSMO layer and the CFO layer, for alternative high density non-volatile memory application, when the heterojunction device is in presence of a magnetic field of 2 to 100 mT at a temperature in the range of 25 to 30° C.

2. The heterojunction device as claimed in claim 1, wherein the thickness of the substrate is 450 to 550 µm.

3. The heterojunction device as claimed in claim 1, wherein the thickness of the LSMO layer is in the range of 100 to 130 nm.

4. The heterojunction device as claimed in claim 1, wherein the thickness of the CFO layer is in the range of 2 to 6 nm.

5. The heterojunction device as claimed in claim 1, wherein heterojunction device exhibits resistive switching voltage in the range of 0.7 to 2V for 2 to 6 nm CFO in the presence of 72 mT magnetic field at temperature in the range of 25 to 30° C.

6. The heterojunction device as claimed in claim 1, wherein the heterojunction device is magneto restrictive and senses magnetic field.

7. A method of detecting a magnetic field using CFO/LSMO comprises;
    a. providing Highly sensitive magnetic heterojunction device as claimed in claim 1;
    b. exposing the device to a magnetic field so as to detect the magnetic field.

8. A method of inducing a magnetic field using CFO/LSMO comprises;
    a. providing Highly sensitive magnetic heterojunction device as claimed in claim 1;
    b. Exposing the device at an electrical current to induce a magnetic field.

9. A process for the preparation of heterojunction device, comprising the steps of:
    a. depositing 100 to 130 nm ($La_{0.66}Sr_{0.34}MnO_3$) LSMO film on 450to 550 µm single crystal (001) $LaAO_3$ (LAO) substrate by Pulse layer deposition (PLD) at about 700° C. in about 100 mTorr oxygen pressure;
    b. masking part of the film as obtained in step (a) followed by growing of 15 to 25 nm LSMO onto the masked surface by PLD at about 700° C. in about 100 mTorr oxygen pressure to form a thin film; and
    c. depositing 2 to 6µm film of CFO on to the LSMO film as obtained in step (b) by PLD at about 700° C. in about 100 mTorr oxygen pressure followed by cooling till temperature in the range of 25 to 30° C. at oxygen pressure of about 400 torr.

* * * * *